United States Patent
Murphy

(10) Patent No.: US 7,592,693 B2
(45) Date of Patent: Sep. 22, 2009

(54) INTERCONNECTING ELECTRICAL DEVICES

(75) Inventor: James V. Murphy, North Kingston, RI (US)

(73) Assignee: Advanced Interconnections Corporation, West Warwick, RI (US)

( * ) Notice: Subject to any disclaimer, the term of this patent is extended or adjusted under 35 U.S.C. 154(b) by 190 days.

(21) Appl. No.: 11/850,832

(22) Filed: Sep. 6, 2007

(65) Prior Publication Data

US 2009/0065918 A1    Mar. 12, 2009

(51) Int. Cl.
    *H01L 23/02* (2006.01)
(52) U.S. Cl. .............. 257/686; 257/688; 257/E23.068; 257/E23.067
(58) Field of Classification Search .......... 257/686, 257/688, E23.067, E23.068
    See application file for complete search history.

(56) References Cited

U.S. PATENT DOCUMENTS

| | | |
|---|---|---|
| 3,740,697 A | 6/1973 | Van Son |
| 4,054,345 A | 10/1977 | Sherwood |
| 5,161,985 A | 11/1992 | Ramsey |
| 5,192,232 A | 3/1993 | Lenz et al. |
| 5,219,295 A | 6/1993 | Niwa et al. |
| 5,453,016 A | 9/1995 | Clark |
| 5,509,825 A | 4/1996 | Reider |
| 5,639,247 A * | 6/1997 | Johnson et al. ............. 439/74 |
| 5,882,212 A | 3/1999 | McHugh |
| 6,256,202 B1 * | 7/2001 | Murphy ..................... 361/704 |
| 6,351,392 B1 * | 2/2002 | Palaniappa ................ 361/785 |
| 6,375,478 B1 | 4/2002 | Kikuchi |
| 2002/0187664 A1 * | 12/2002 | Murphy et al. .............. 439/70 |

OTHER PUBLICATIONS

Handout received at a tradeshow from Hypertronics Corporation, date unknown.

* cited by examiner

*Primary Examiner*—Trung Dang
(74) *Attorney, Agent, or Firm*—Occhiuti Rohlicek & Tsao LLP

(57) ABSTRACT

An intercoupling component includes first male contacts, each first male contact received within a corresponding aperture of a first array of apertures and extending beyond a second surface of a first insulative support member toward a second insulative support member, each first male contact having a first axis; second contacts, each second contact received within a corresponding aperture of a second array of apertures, each second contact having a second axis; and an alignment member configured to establish a specified position of the first insulative support member relative to the second insulative support member. The first axis of each male contact is offset from the second axis of a corresponding second contact when the first insulative support member is in the specified position relative to the second insulative support member.

20 Claims, 14 Drawing Sheets

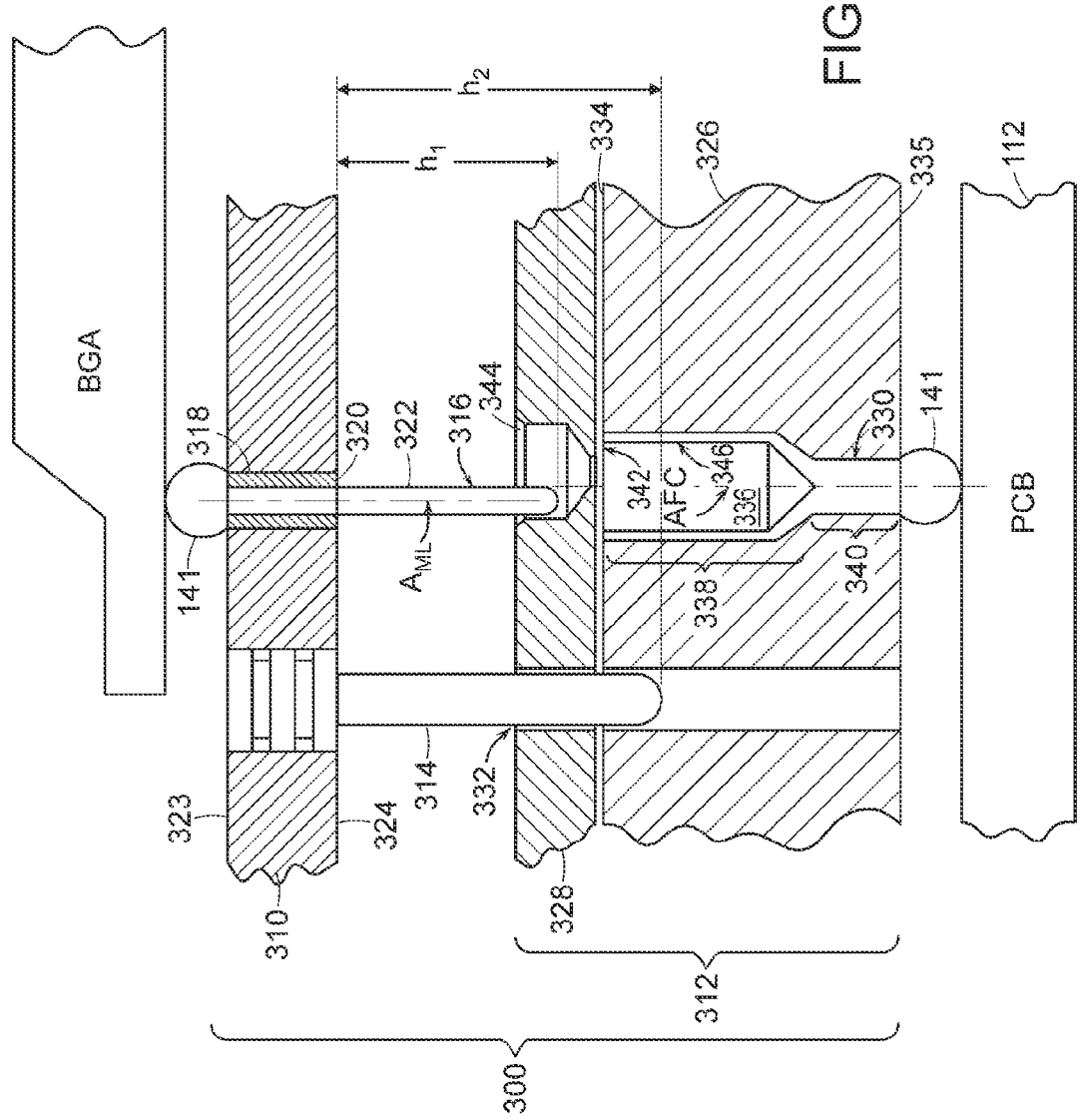

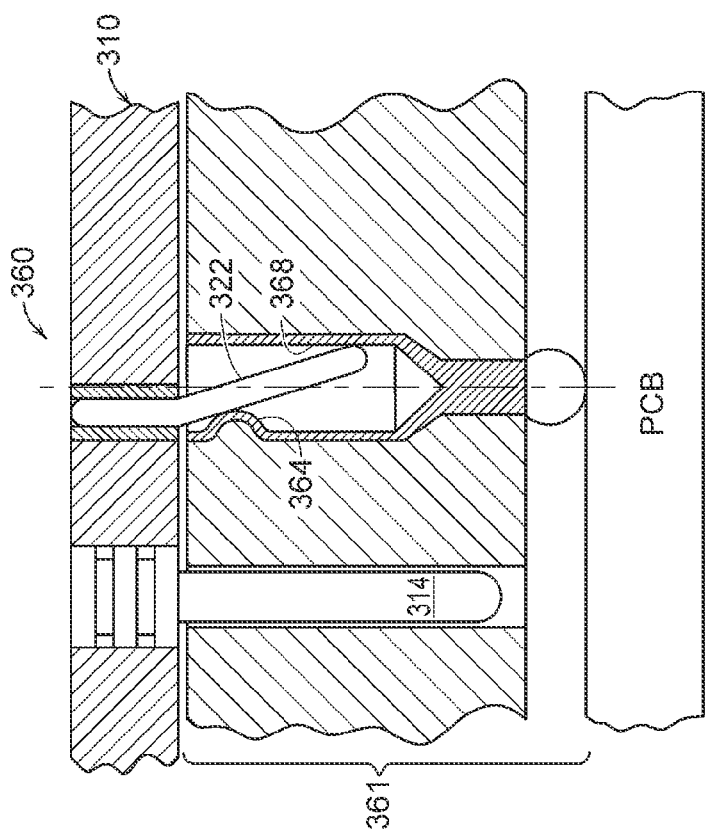
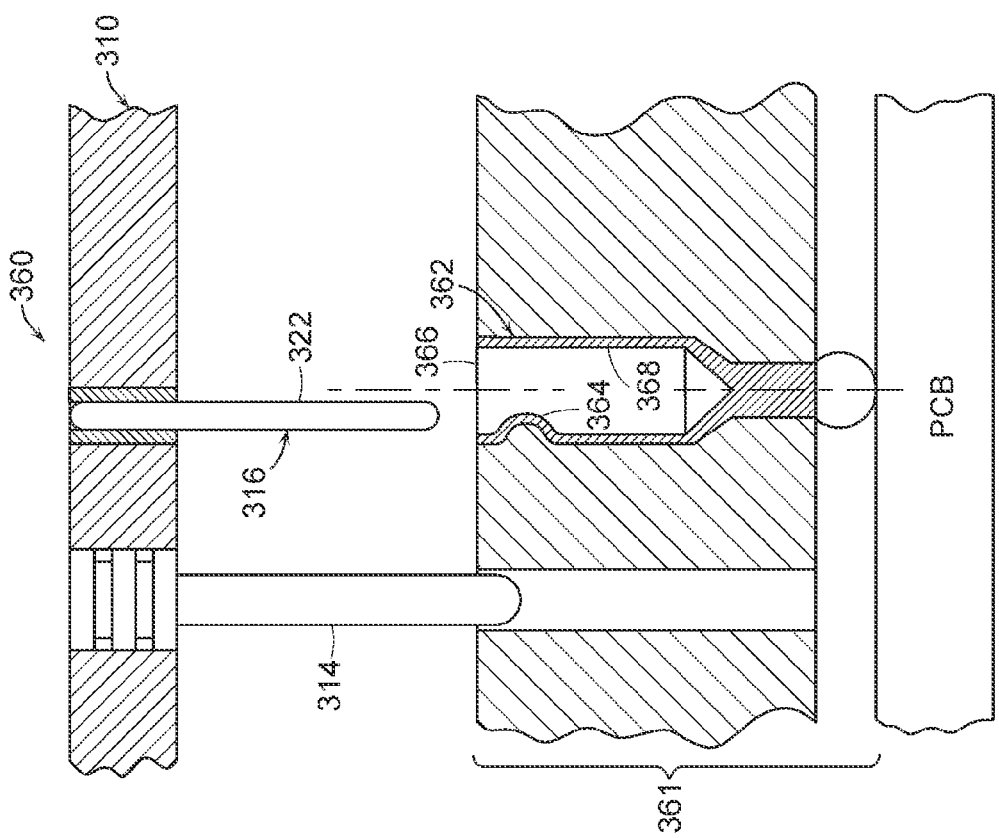
FIG. 6A
FIG. 6B

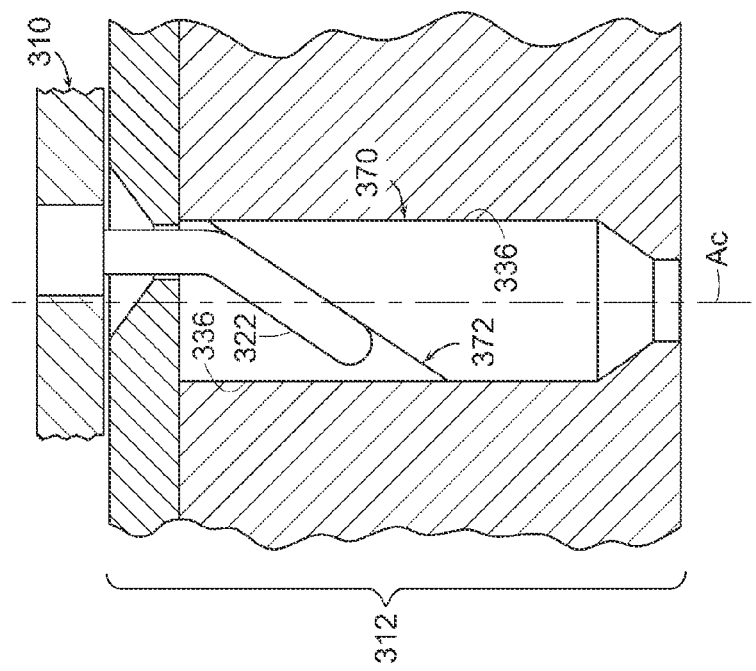
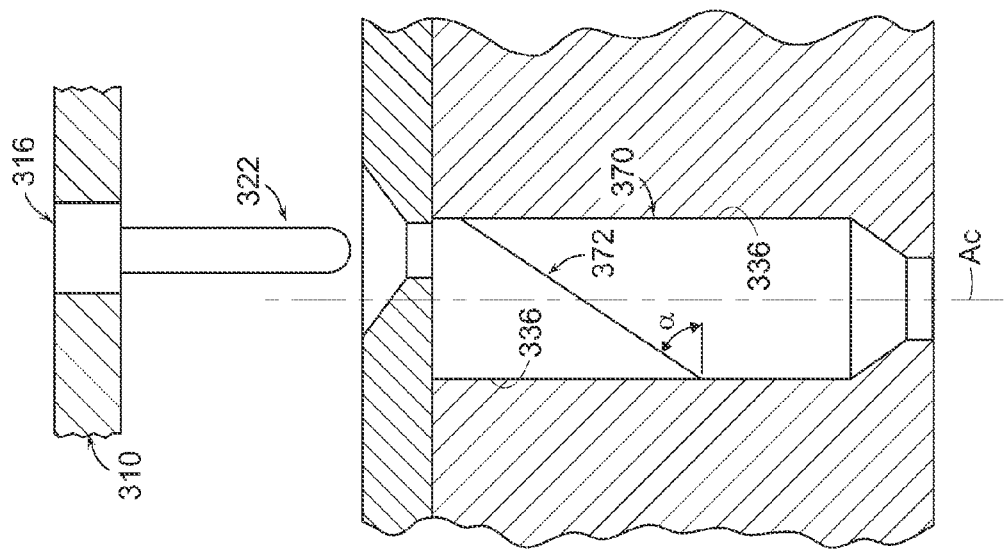
FIG. 7A
FIG. 7B

INTERCONNECTING ELECTRICAL DEVICES

TECHNICAL FIELD

This disclosure relates to making connections between electrical devices.

BACKGROUND

Ball grid array (BGA) packages are becoming increasingly popular because of their low profiles and high densities. The rounded solder ball contacts of a BGA are generally soldered directly to corresponding surface mount pads of a printed circuit board rather than to plated thruholes which receive pins from, for example, a pin grid array IC package. However, once a BGA package is soldered to the printed circuit board, the soldered balls of the BGA package are difficult and expensive to inspect. Moreover, the packages are difficult to remove, for example, in situations where the IC package requires repairing or upgrading.

SUMMARY

In one aspect, an intercoupling component includes: a first insulative support member including a first array of apertures extending from an first surface to an opposite second surface of the first insulative support member; a second insulative support member including a second array of apertures extending from an first surface to an opposite second surface of the second insulative support member, the second array of apertures located in a pattern corresponding to the first array of apertures; a plurality of first male contacts, each first male contact received within a corresponding aperture of the first array of apertures and extending beyond the second surface of the first insulative support member toward the second insulative support member, each first male contact having a first axis; a plurality of second contacts, each second contact received within a corresponding aperture of the second array of apertures, each second contact having a second axis; and an alignment member configured to establish a specified position of the first insulative support member relative to the second insulative support member. The first axis of each male contact is offset from the second axis of a corresponding second contact when the first insulative support member is in the specified position relative to the second insulative support member. Embodiments can include one or more of the following features.

In some embodiments, intercoupling components also include a deflection member configured to contact one of the plurality of male contacts. In some cases, the deflection member includes a cone-shaped surface of the second insulative support member. In some cases, the second contacts are female contacts and the deflection member comprises a projection extending inward from an inner surface of one of the plurality of female contacts. In some cases, the second contacts each comprise an angled solid surface extending across the aperture of the second array of apertures receiving the second contact, the angled solid surface forming the deflection member.

In some embodiments, the alignment member includes first peripheral members extending from a first surface of a base with the base and the first peripheral members define a first interior cavity of the alignment member that receives the first insulative support member. In some cases, the intercoupling components also include second peripheral members extending from a second surface of the base opposite the first surface of the base with the second peripheral members and the base defines a second interior cavity of the alignment member that slidably receives the second insulative support member. In some cases, the second peripheral members are resilient members biased toward a rest position.

In some embodiments, the alignment member includes an alignment pin. In some cases, the alignment pin extends beyond the first surface of the first insulative support member toward the second insulative support member farther than the male contacts extend.

In one aspect, an intercoupling component, of the type used to electrically connect an array of electrical connection regions disposed on a first substrate to an array of electrical connection regions disposed on a second substrate, includes: a first insulative support member including a first array of apertures extending from an first surface to an opposite second surface of the first insulative support member, the first array of apertures located in a pattern corresponding to the array of electrical connection regions on the first substrate; a second insulative support member including a second array of apertures extending from an first surface to an opposite second surface of the second insulative support member, the second array of apertures located in a pattern corresponding to the array of electrical connection regions on the second substrate; a plurality of first male contacts, each first male contact received within a corresponding aperture of the first array of apertures, each first male contact comprising a first portion coupled to the first insulative support member, a second portion spaced apart from the first portion, and a transition portion disposed between the first portion and the second portion wherein each first male contact is bent in the transition portion; and a plurality of second male contacts, each second male contact received within a corresponding aperture of the second array of apertures and extending beyond the second surface of the second insulative support member toward the first insulative support member. Embodiments can include one or more of the following features.

In some embodiments, each second male contact extends substantially linearly from a first end attached to the second insulative support member to a second end.

In some embodiments, each second male contact includes a first portion coupled to the first insulative support member, a second portion spaced apart from the first portion, and a transition portion disposed between the first portion and the second portion wherein each second male contact is bent in the transition region.

In some embodiments, each aperture of the first array of apertures is sized to slidably receive a corresponding second male contact. In some cases, each aperture of the first array of apertures has a first section having a transverse cross-sectional area and has a second section having a second transverse cross-sectional area that is larger than the first transverse cross-sectional area. In some cases, each first male contact is disposed with the first portion of the first male contact engaging sidewalls of the first section of a corresponding aperture of the first array of apertures.

In some embodiments, intercoupling components also include an alignment member configured to establish a specified position of the first insulative support member relative to the second insulative support member. In some cases, the alignment member includes first peripheral members extending from a first surface of a base, the base and the first peripheral members defining a first interior cavity of the alignment member, the first interior cavity receiving the first insulative support member. In some cases, intercoupling components also include second peripheral members extending from a second surface of the base opposite the first surface of the base, the second peripheral members and the base defining a second interior cavity of the alignment member that slidably receives the second insulative support member. In some cases, the second peripheral members are resilient members biased toward a rest position.

Embodiments may have one or more of the following advantages.

Intercoupling components in which electrical connections are provided by engaged male contacts can be manufactured without female contacts. Fewer parts are required and, typically, male contacts can be manufactured (e.g., by stamping) at a lower cost than corresponding female contacts. In embodiments with similar thicknesses of plastic separating adjacent contact assemblies, the reduced number of parts can allow for reduced pin pitch (e.g., spacing between adjacent contacts) and increased connection density.

As used herein, upper and lower are used for ease of describing features shown in the figures and do not imply any specific absolute or relative positions or orientations.

The details of one or more embodiments of the invention are set forth in the accompanying drawings and the description below. Other features, objects, and advantages of the invention will be apparent from the description and drawings, and from the claims.

DESCRIPTION OF DRAWINGS

FIGS. 5A and 5B are cross-sectional views of a portion of an intercoupling component in open and closed positions, respectively.

FIGS. 6A and 6B are cross-sectional views of a portion of an intercoupling component in open and closed positions, respectively.

FIGS. 7A and 7B are cross-sectional views of a portion of an intercoupling component in open and closed positions, respectively.

Like reference symbols in the various drawings indicate like elements.

DETAILED DESCRIPTION

Figure 1A:
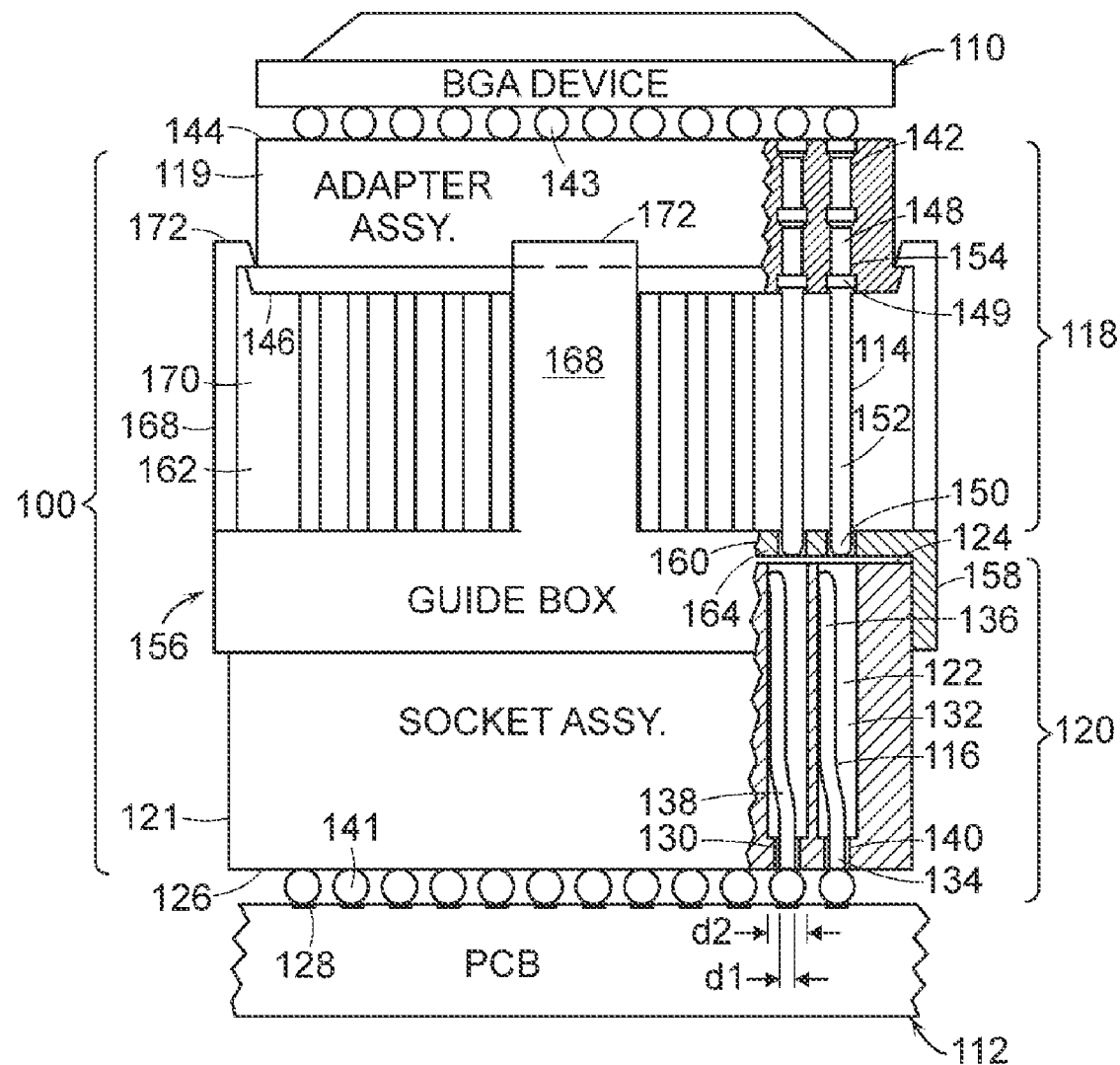
FIGS. 1A and 1B are partially cut-away side views of an intercoupling component in open and closed positions, respectively.
Figure 1B:
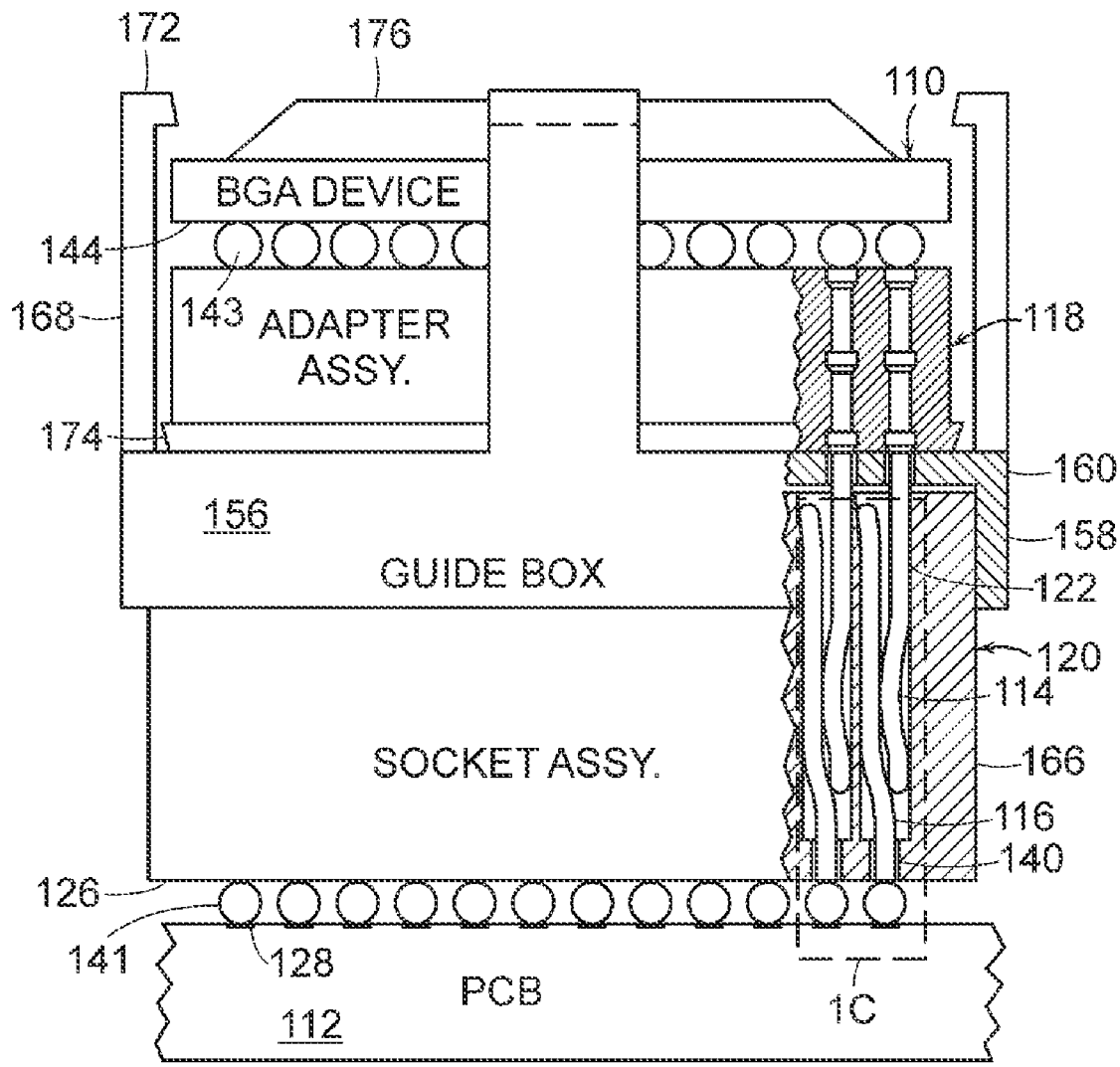
Figure 1C:
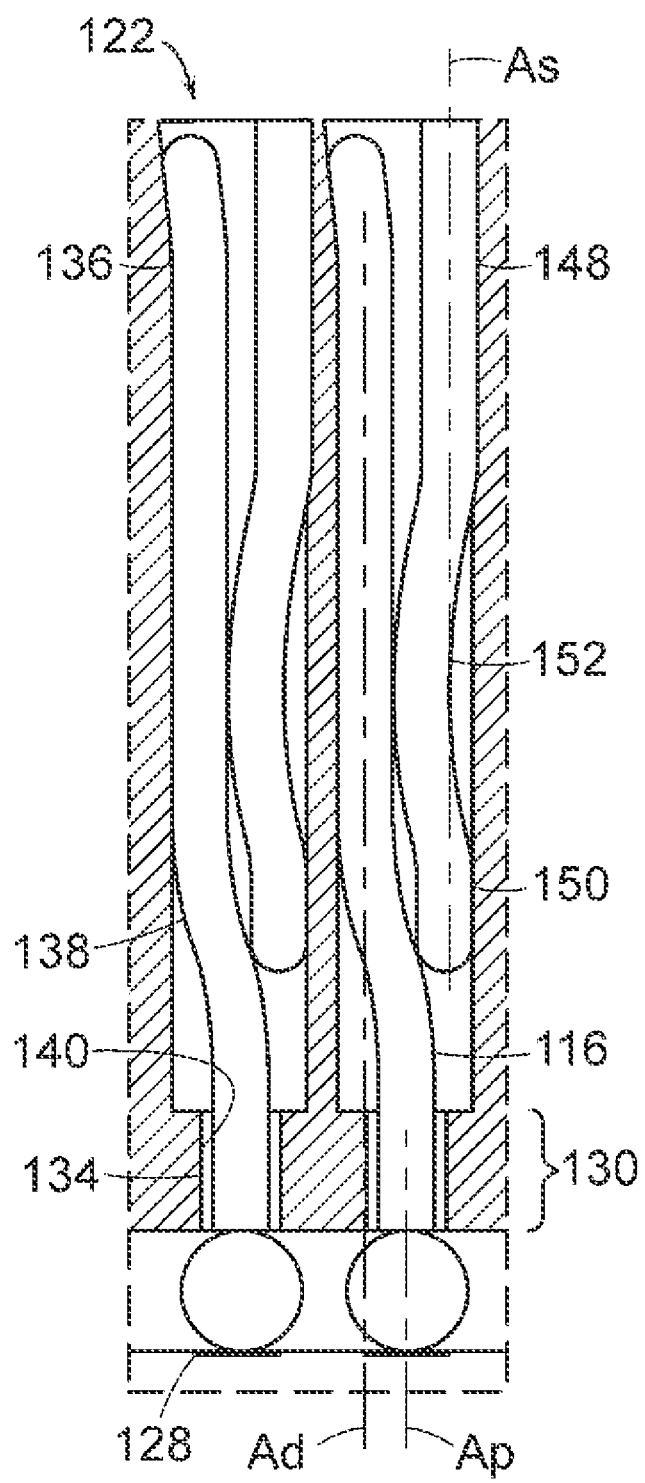
FIG. 1C shows a portion of the intercoupling component of FIGS. 1A and 1B in more detail.

Referring to FIGS. 1A, 1B, and 1C, an intercoupling component 100 provides electrical interconnections between a BGA device 110 and a printed circuit board 112. Intercoupling component 100 includes an adapter assembly 118 and a socket assembly 120 which, respectively, include bent male contacts 114 and bent male contacts 116. When adapter assembly 118 and socket assembly 120 are introduced to each other, the bent shape of male contacts 114, 116 are mechanically biased toward each other when the male contacts as shown in FIGS. 1B and 1C that maintains the engagement. The engagement between male contacts 114 and male contacts 116 can provide electrical connections between male contacts 114 and male contacts 116 provide a friction fit which mechanically holds adapter assembly 118 and socket assembly 120 together.

Socket assembly 120 includes an insulative member 121 with apertures 122 for receiving bent male contacts 116. Apertures 122 extend from an upper surface 124 to a lower surface 126 of insulative member 121 and are arranged in an array with a pattern that corresponds to the array of electrical connection regions 128 on printed circuit board 112. Each aperture 122 has a first section 130 having a first diameter $d_1$ and has a second section 132 having a second diameter $d_2$ that is larger than first diameter $d_1$. Insulative member 121 formed of an electrically insulative material such as, for example, FR-4 or liquid crystal polymer (LCP). In this embodiment, socket assembly 120 structurally supports male contacts 116 as well as provides electrical insulation between the male contacts.

Apertures 122 have circular transverse cross-sections. However, apertures can have other configurations including for example, square transverse cross-sections. Typically, each aperture has a first section having a first transverse cross-sectional area and has a second section having a second transverse cross-sectional area that is larger than the first transverse cross-sectional area. However, in some embodiments, male contacts are received in the apertures with a constant transverse cross-sectional area.

Each male contact 116 is at least partially disposed within a corresponding aperture 122. Male contacts 116 have a first portion 134 engaging walls 140 of first section 130 in a friction fit. Male contacts 116 extend into the second sections 132 of apertures 122 which are sized to slidably receive male contacts 114. A second portion 136 of each male contact 116 is spaced apart from first portion 134 with a transition portion 138 disposed between first portion 134 and second portion 136. Each male contact 116 is bent in transition region 138. Specifically, an axis $A_p$ (see FIG. 1C) of first section 134 of male contacts 116 is offset (e.g., laterally offset) from an axis $A_d$ (see FIG. 1C) of second section 136 of male contacts 116. Male contacts 116 are formed of conductive material such as, for example, beryllium copper. Male contacts 116 include solder balls 141 which connect male contacts to electrical connection regions 128 on printed circuit board 112. In other embodiments, male contacts 116 include other connection mechanisms including, for example, solder tails to provide mechanical attachment and electrical connection between socket assembly 120 and printed circuit board 112.

Adapter assembly 118 includes an insulative member 119 with apertures 142 for receiving corresponding bent male contacts 114. Apertures 142 extend from an upper surface 144 to an opposite lower surface 146 of insulative member 119 and are arranged in an array with a pattern that corresponds to the array of apertures 122. Like insulative member 119 of socket assembly 120, insulative member 119 is formed of an electrically insulative material such as, for example, FR-4 or LCP. In this embodiment, adapter assembly 118 structurally supports male contacts 114 and provides electrical insulation between the male contacts.

Referring again to FIG. 1A, each male contact 114 has a first portion 148 with rings 149 that engage walls 154 of adapter assembly 118. Male contacts 114 extend beyond lower surface 146 of adapter assembly 118 and are sized to be received within apertures 122 of socket assembly 120. A second portion 150 of each male contact 114 is spaced from first portion 148 with a transition portion 152 disposed between first portion 148 and second portion 150. Each male contact 114 is bent in transition region 152. When engaged with male contacts 116, first portion 148 and second portion 150 of each male contact 114 are aligned (e.g., share a common axis $A_s$, see FIG. 1C). Transition portion of each male contact 152 is laterally offset relative to first portion 148 and second portion 150 of the male contact 114. Male contacts 114 formed of conductive material such as, for example, beryllium copper. Solder balls 143 on BGA device 110 are used to connect male contacts 114 to BGA device 110. Male contacts 114 are resilient members biased toward rest positions (e.g., the positions shown in FIG. 1A).

A guide box 156 positions adapter assembly 118 relative to socket assembly 120. Guide box 156 includes peripheral walls 158 extending from a base 160 to define a first interior cavity 162 sized to receive socket assembly 120. Apertures 164 extend through base 160 of guide box 156 and are sized to receive male contacts 114. Socket assembly 120 is disposed in first interior cavity 162 of guide box 156 with second sections 132 of apertures 122 of socket assembly 120 aligned with apertures 164 of guide box 156. The close fit between peripheral walls 158 of guide box 156 and outer surfaces 166 of socket assembly 120 maintains the position of guide box 156 relative to socket assembly 120. In some embodiments, guide box 156 can be attached to socket assembly 120 by other techniques including, for example, the use of adhesives.

Guide box 156 also includes resilient arms 168 extending from base 160 (on the opposite side from peripheral walls 158) to inwardly extending locking ends 172. Resilient arms 168 are biased toward the rest positions shown in FIGS. 1A and 1B and define a second interior cavity 170 sized to receive adapter assembly 118. When assembled, adapter assembly 118 is disposed in second interior cavity 170 with the bias of resilient arms 168 toward their rest positions maintaining engagement between locking ends 172 and adapter assembly 118.

In one application, intercoupling components 100 is used to mount BGA device 110 within a piece of electrical equipment that has been assembled separately. In this exemplary use, socket assembly 120 is soldered to printed circuit board 112 and BGA device 110 is soldered to an adapter assembly 118. BGA device 110 and attached adapter assembly 118 are pressed into second interior cavity 170 of guide box 156 with laterally extending edges 174 of adapter assembly 118 forcing locking ends 172 of resilient arms 168 radially outward. After laterally extending edge 174 of adapter assembly 118 passes through the enlarged opening between locking ends 172, the bias of resilient arms 168 toward their rest positions maintains engagement between locking ends 172 and adapter assembly 118 with intercoupling component 100 in the open position shown in FIG. 1A. In this position, male contacts 114 are positioned with their ends in apertures 164 of base 160 but male contacts 114 do not contact male contacts 116. Engagement between locking ends 172 of resilient arms 168 and laterally extending edge 174 of adapter assembly 118 limits movement of adapter assembly 118 away from socket assembly 120 while allowing movement of adapter assembly 118 toward socket assembly 120.

Pressure applied to an upper surface 176 of BGA device 110 moves intercoupling component 100 into the closed position shown in FIG. 1B. As BGA device 110 and adapter assembly 118 move downward in second interior cavity 170 of guide box 156, male contacts 114 pass through apertures 164 into apertures 122 of socket assembly 120. Engagement between male contacts 114 and male contacts 116 provides wiping contact and an electrical connection between male contacts 114 and male contacts 116.

Figure 2:
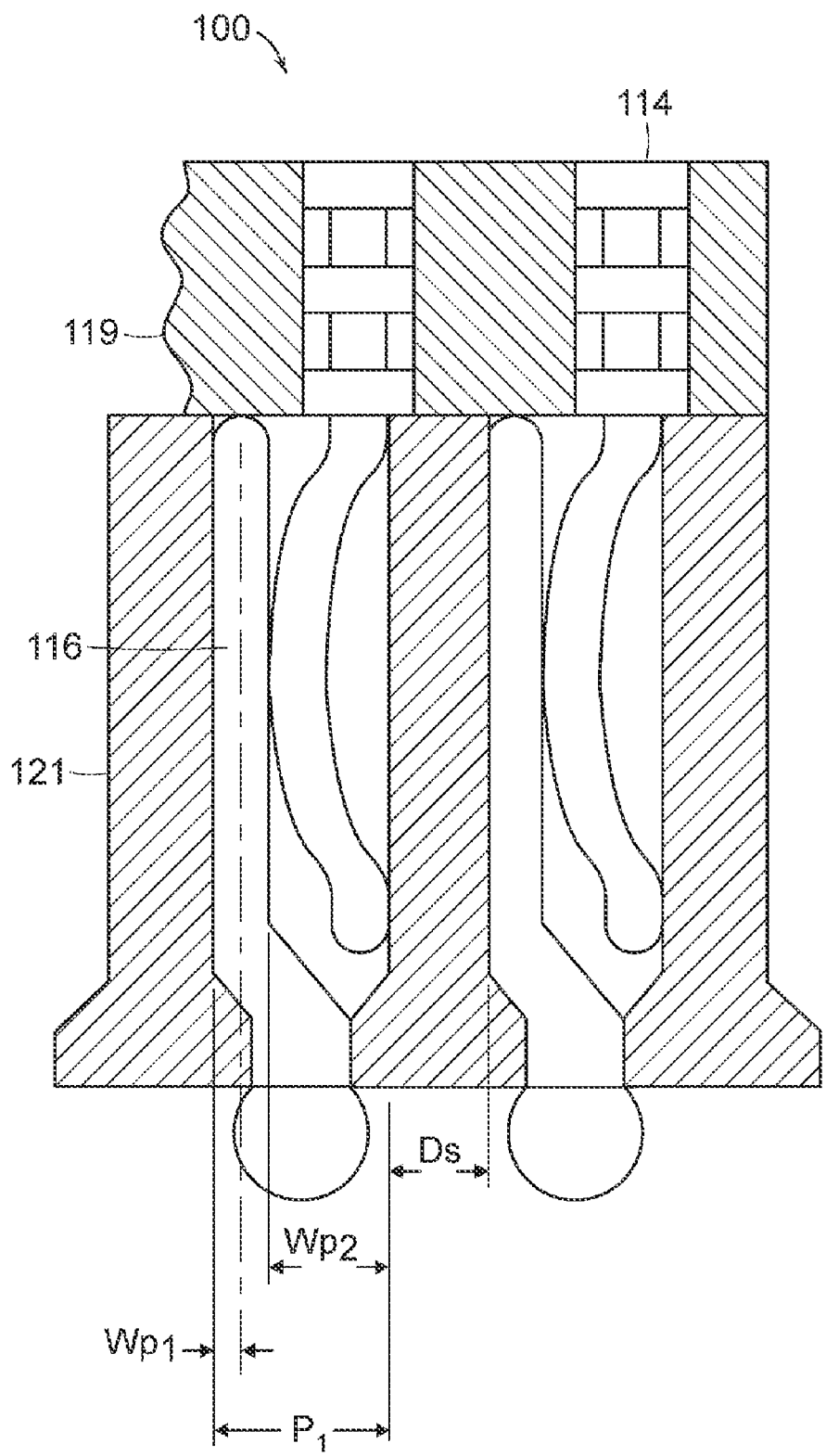
FIG. 2 shows a portion of an intercoupling component.

Referring to FIG. 2, in an alternative embodiment, an intercoupling component 100 in which electrical connections are provided by engaged male contacts 114, 116 can be manufactured without female contacts.

Figure 3:
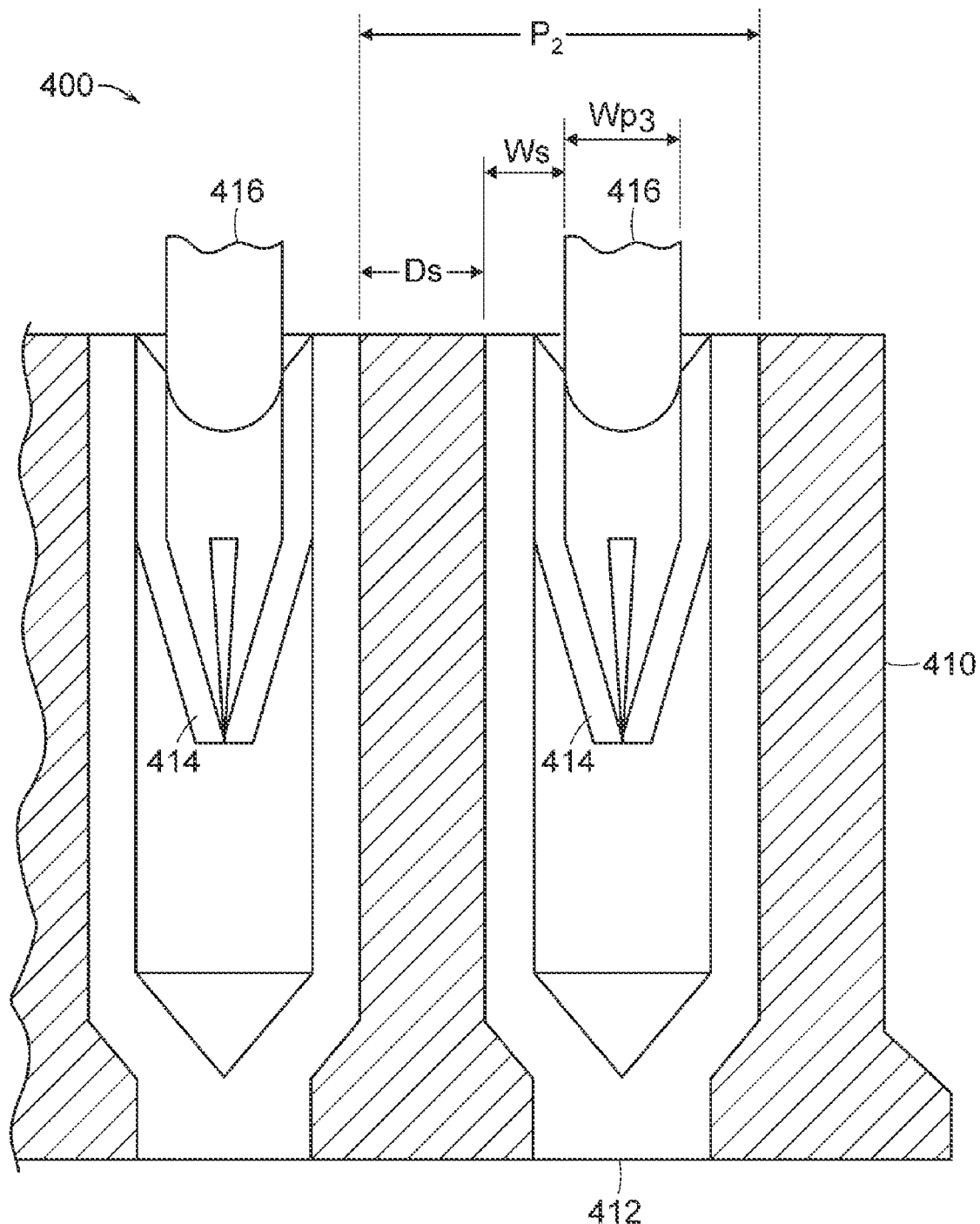
FIG. 3 shows a portion of a prior art intercoupling component.

In this embodiment, male contacts 416, referring to FIG. 3, an exemplary prior art intercoupling component 400 includes an insulative member 410 receiving sockets 412 within each of which is disposed a contact spring 414. Sockets 412 and contact springs 414 are sized to receive and engage a male contact 416. An example of intercoupling components 400 is described in more detail in U.S. Pat. No. 7,179,108, incorporated herein by reference in its entirety. Referring to both FIGS. 2 and 3, intercoupling component 100 requires fewer parts than intercoupling component 400. Male contacts 114, 116 typically can be manufactured (e.g., by stamping) at a lower cost than corresponding female contacts (e.g., sockets 412 and contact springs 414). Thus, in some cases, intercoupling components 100 have a lower unit cost than comparable intercoupling components 400.

Still referring to both FIGS. 2 and 3, intercoupling component 100 can also provide other advantages. For example, intercoupling component 100 has a pitch $P_1$ that allows for a standard thickness $D_s$ of insulating material between adjacent contacts 116, a width $W_{p1}$ of male contact 116, a width $W_{p2}$ of male contact 114. In contrast, intercoupling component 400 requires a pitch $P_2$ that allows for a standard thickness $D_s$ of insulating material between adjacent contacts 412, twice width $W_s$ of socket 412 and contact spring 414 (e.g., on both sides of male contact 416), and a width $W_{p3}$ of male contact 416. Thus, in embodiments with similar thicknesses ($D_s$) of plastic separating adjacent contact assemblies, the reduced number of parts in intercoupling component 100 can allow for reduced pitch (e.g., spacing between adjacent contacts) and increased connection density.

Figure 4:
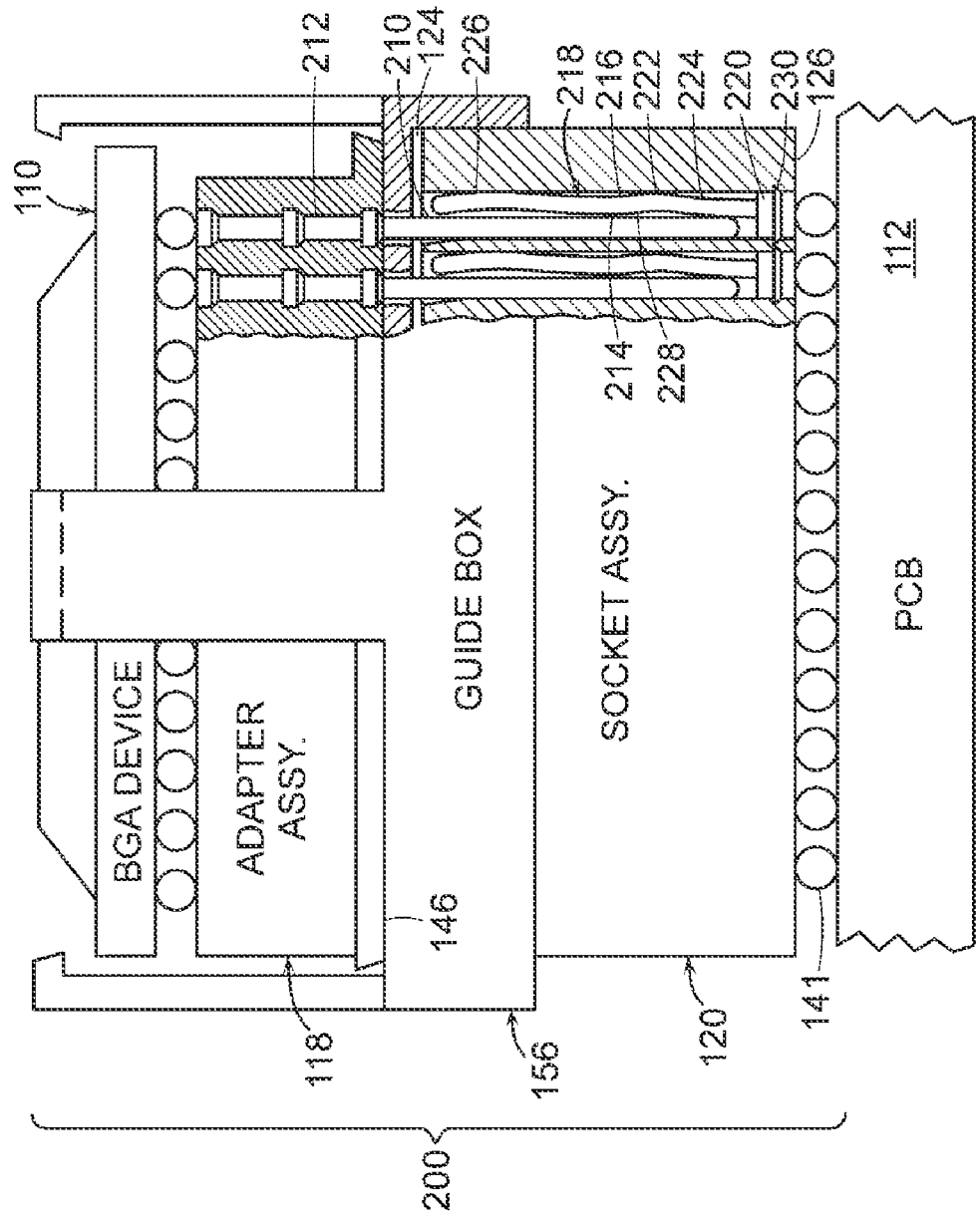
FIG. 4 is a partially cut-away side view of an intercoupling component in the closed position.

Some intercoupling components can be configured with a combination of straight male contacts and bent male contacts. For example, referring to FIG. 4, an intercoupling component 200 includes socket assembly 120, guide box 156, and adapter assembly 118. However, in contrast to bent male contacts 114 (see FIGS. 1A, 1B, and 1C), male contacts 210 are straight pins extending from a first portion 212 received in adapter assembly 118 to a second portion 214 disposed below lower surface 146 of adapter assembly 118. Male contacts can be, but are not necessarily, resilient. Apertures 216 in socket assembly 120 have a consistent transverse cross-sectional area from upper surface 124 to lower surface 126 of socket assembly 120. Male contacts 218 mounted in socket assembly 120 include a base 220, a pin 222, and a solder ball 141. A first portion 224 of male contact 218 extends through base 220 to electrically connect with solder ball 141. Bases 220 of male contacts 218 include radially extending protrusions 230. When male contacts 218 are pressed into apertures 216 during manufacture of socket assembly 120, protrusions 230 frictionally engage sidewalls of apertures 216. Male contacts 218 can, additionally or alternatively, be adhesively attached to socket assembly 120.

A second portion 226 of each male contact 218 is spaced apart from first portion 224 with a transition portion 228 disposed between first portion 224 and second portion 226. Each male contact 218 is bent in transition region 228. Male contacts 218 are formed of conductive material such as, for example, beryllium copper. Pins 222 are resilient members biased toward a rest position. When pressure is applied to BGA device 110 to place intercoupling component 200 in its closed position, engagement between male contacts 210 and male contacts 218 displaces male contacts 218 from their rest positions. The bias of male contacts 218 toward their rest positions provides wiping contact and an electrical connection between male contacts 210 and male contacts 218. This configuration can provide multiple points of contact (e.g., at first portion 224 and at transition portion 228) between male contacts 210 and male contacts 218.

Figure 5B:
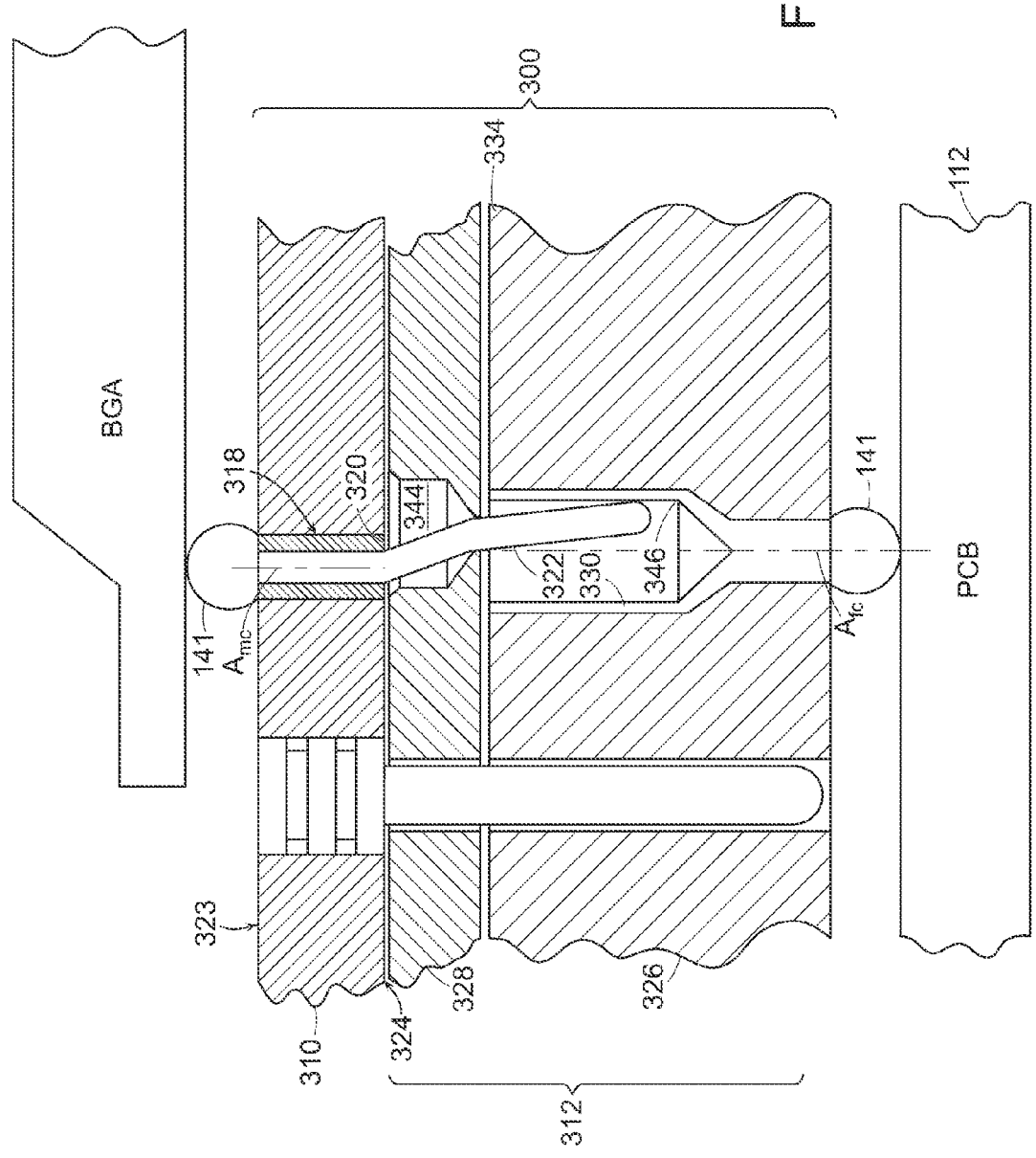

FIGS. 5A and 5B are cross-sectional views of a portion of an intercoupling component 300 in open and closed positions, respectively. Intercoupling component 300 includes an adapter assembly 310 and a socket assembly 312. Adapter assembly 310 includes at least one alignment member 314 and a plurality of resilient male contacts 316 disposed in an array of apertures 318 extending from an upper surface 323 to an opposite lower surface 324 of adapter assembly 310. Male contacts 316 include a base 320 and a pin 322. Male contacts 316 are disposed in apertures 318 of adapter assembly 310 with ends of male contacts 316 extending a distance $h_1$ beyond lower surface 324 of adapter assembly 310. Male contacts 316 are resilient members biased toward rest positions (e.g., the positions shown in FIG. 5A). Alignment member(s) 314 are alignment pin(s) extending a distance $h_2$ beyond lower surface 324 of adapter assembly 310 that is greater than $h_1$.

Socket assembly 312 includes an insulative member 326, a deflection member 328, and a plurality of female contacts 330 disposed an array of apertures 336 extending from an upper surface 334 to an opposite lower surface 335 of insulative member 326. The array of apertures 336 are located in a pattern corresponding to the pattern of the array of apertures 318. Apertures 336 include a first section 338 having a greater cross-sectional area than a second section 340. Female contacts 330 are press-fit into apertures 336 through first section 338 of apertures 336 with open ends 342 of female contacts facing upper surface 334 of insulative member 326. Female contacts 330 may be held in place by frictional engagement with insulative member 326 and/or by other techniques including, for example, the use of adhesives. Deflection member 328 is attached to upper surface 334 of insulative member 326 after female contacts 330 are installed. Deflection member 328 is molded with an array of funnel-shaped apertures 344. In some embodiments, deflection member 328 is integrated as part of the insulative member 326.

In use, alignment members 314 are inserted into corresponding apertures 332 in socket assembly 312 to position adapter assembly 310 relative to socket assembly 312. In position, each male contact 316 has an axis $A_{mc}$ that is offset from an axis $A_{fc}$ of a corresponding female contact 330 when the relative positions of adapter assembly 310 and socket assembly 312 are fixed by alignment members 314. Adapter assembly 310 and socket assembly 312 are pressed together to place intercoupling component 300 in its closed position. Resilient pins 322 of male contacts 316 engage and are deflected by deflection member 328 such that resilient pins 322 contact inner surfaces 346 of female contacts 330. Other embodiments of deflection members are also possible.

Referring to FIGS. 6A and 6B, intercoupling component 360 includes adapter assembly 310 (as described above) and socket assembly 361. Socket assembly 361 includes female contacts 362 which each incorporate a deflection member 364 in the form of a protrusion extending into an inner cavity 366 of female contacts 362. Adapter assembly 310 and socket assembly 361 are pressed together to place intercoupling component 360 in its closed position. Resilient pins 322 of male contacts 316 engage and are deflected by deflection member 364 such that resilient pins 322 contact inner surface 368 of female contacts 362. Incorporation of deflection member 364 into female contact 362 can allow for production of socket assemblies with the reduced height relative to socket assemblies in which the deflection members are separate pieces attached to the insulative members in which female contacts are installed. This configuration also provides two points of contact between pin 322 and female contact 362.

A number of embodiments of the invention have been described. Nevertheless, it will be understood that various modifications may be made without departing from the spirit and scope of the invention.

In one example, referring to FIGS. 7A and 7B, intercoupling component 300 (see FIGS. 5A and 5B) can be configured with contacts 370 rather than female contacts 330 (see FIGS. 5A and 5B). Contacts 370 each have a solid surface 372 disposed at an angle α relative to an axis $A_c$. Solid surfaces 372 of contacts 370 extend across apertures 336 which receive contacts 370. In use, adapter assembly 310 and socket assembly 312 are pressed together to place intercoupling component 300 in its closed position. Resilient pins 322 of male contacts 316 engage and are deflected by solid surface 372 with the contact between solid surface 372 and resilient pins 322 providing an electrical connection between male contact 316 and contacts 370. Angled solid surface 372 forms the deflection member in this embodiment of intercoupling component 300.

In another example, the applications discussed involve interconnecting printed circuit boards and BGA devices. The embodiments discussed above and similar devices can also be used to interconnect electrical devices and components including, for example, land grid array (LGA) devices, plastic quad flat packs (PQFPs), and board-to-board (B2B) connectors.

Figure 8:
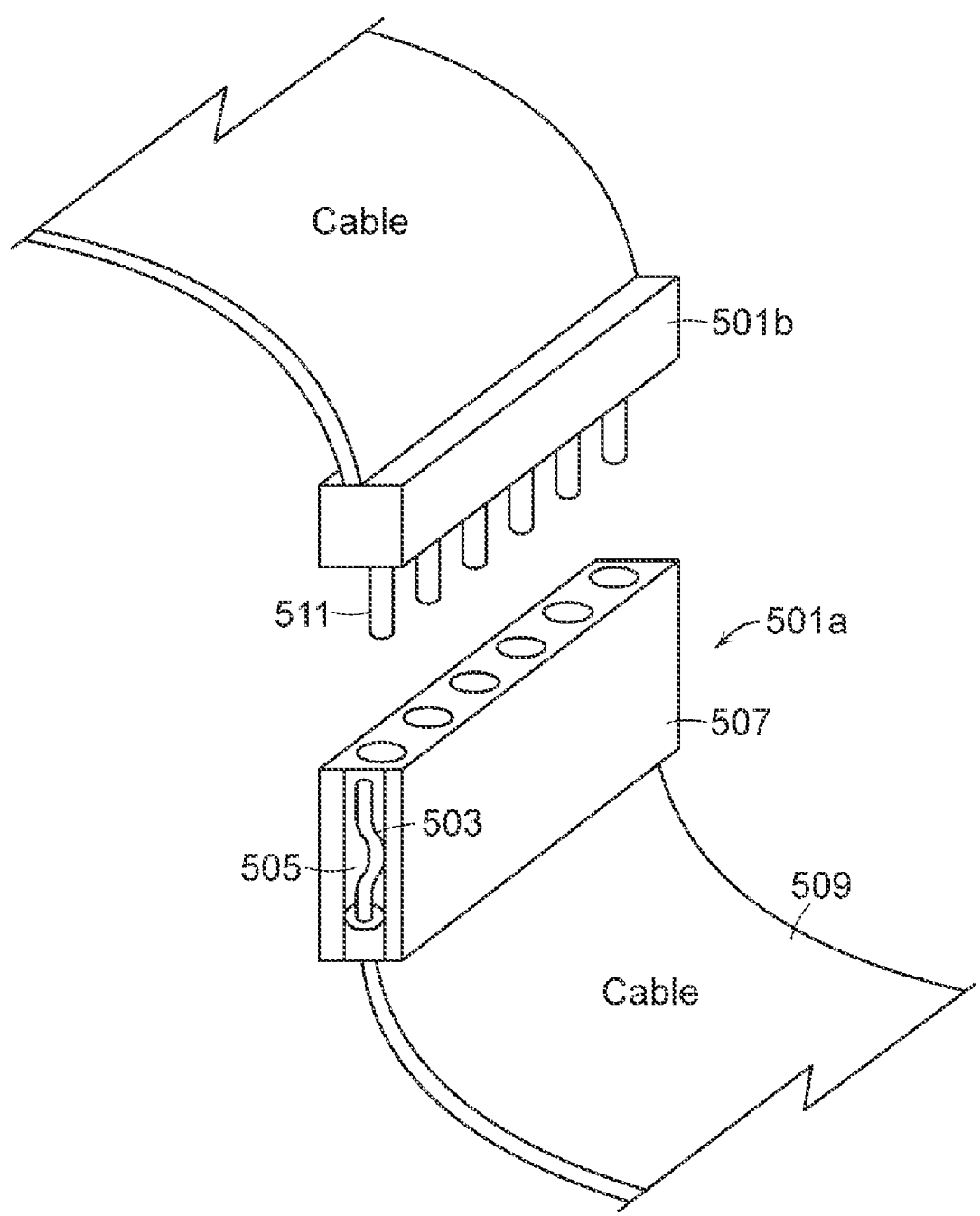
FIG. 8 is a perspective view of an inline cable connector.
Figure 9A:
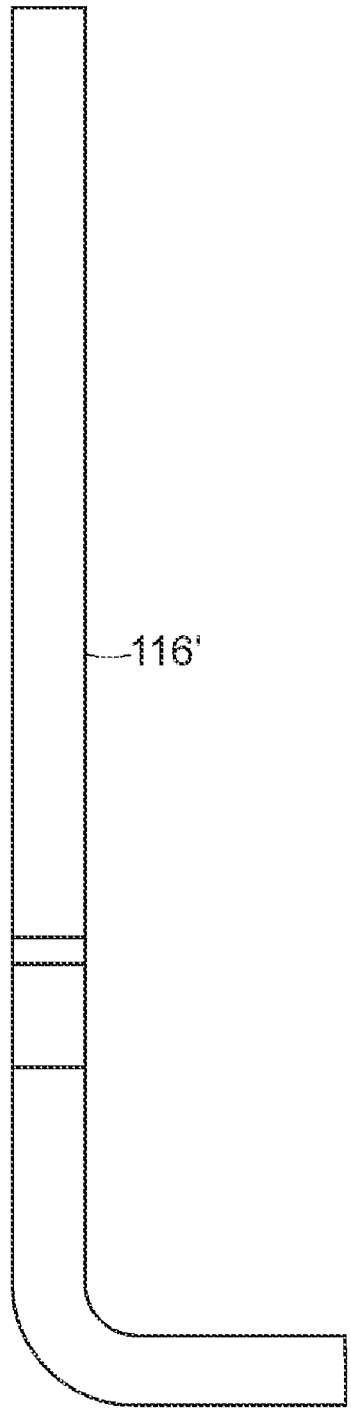
FIGS. 9A and 9B are, respectively, side and end views of a male connector.
Figure 9B:
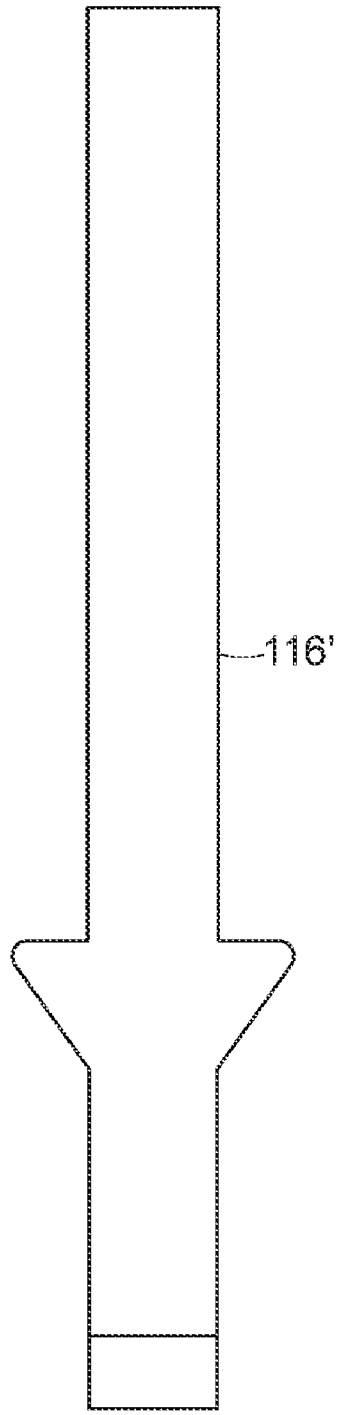
Figure 10B:
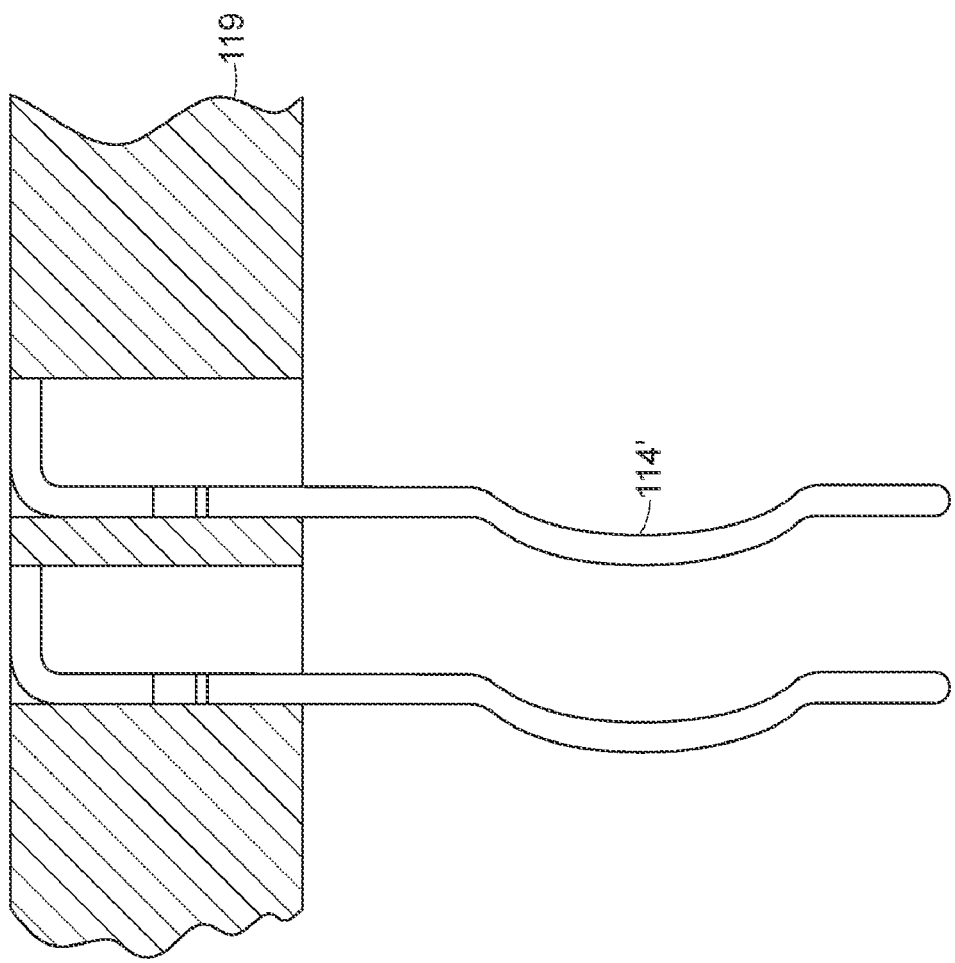
FIGS. 10A and 10B are, respectively, perspective and cross-sectional views of a male connector.
Figure 10A:
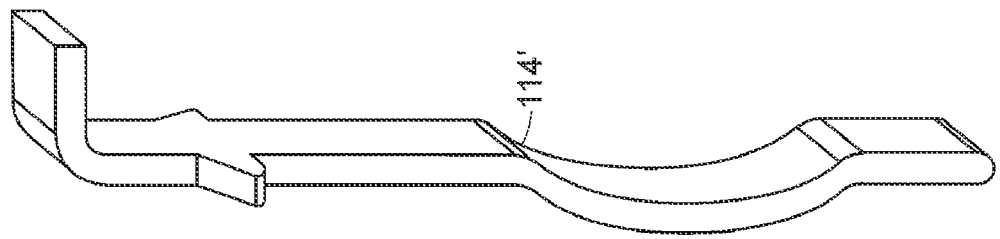

Referring to FIG. 8, in another embodiment, an intercoupling component 501 is in the form of a ribboned single inline cable connector 501a. The single in-line connector 501a represents the female portion of a mating pair of ribboned cable connectors 501, 501b. Female cable connector 501a includes bent male contacts 503 disposed in apertures 505 of an insulative socket housing 507. Each male contact 503 is attached at one end to a corresponding male conductor of a ribbon cable 509. The opposite ends of each male contact 503 are connected to corresponding male pins 511 of a ribboned cable 501b.

In another example, referring to FIGS. 9A, 9B, 10A, and 10B, intercoupling component 100 can be implemented with stamped and formed male connectors 114', 116' in place of cylindrical male connectors 114, 116 (see FIGS. 1A-1C).

Figure 11B:
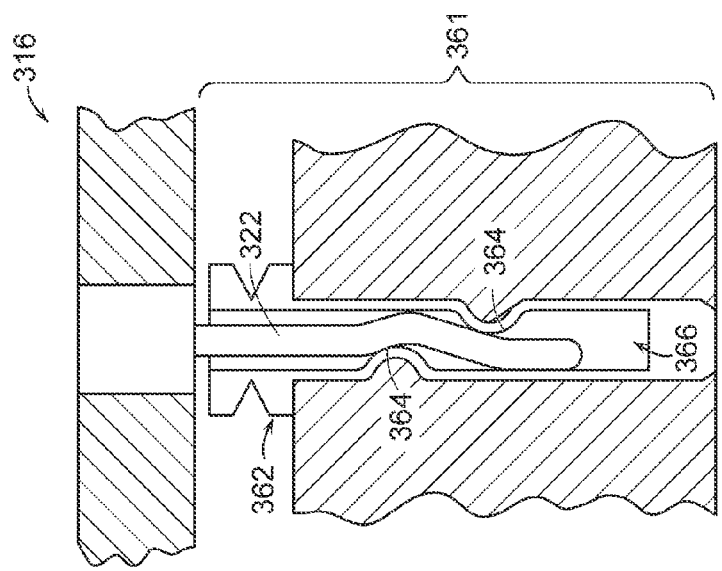
FIGS. 11A and 11B are cross-sectional side views of a portion of an alternative embodiment of an intercoupling component in open and closed positions, respectively.
Figure 11A:
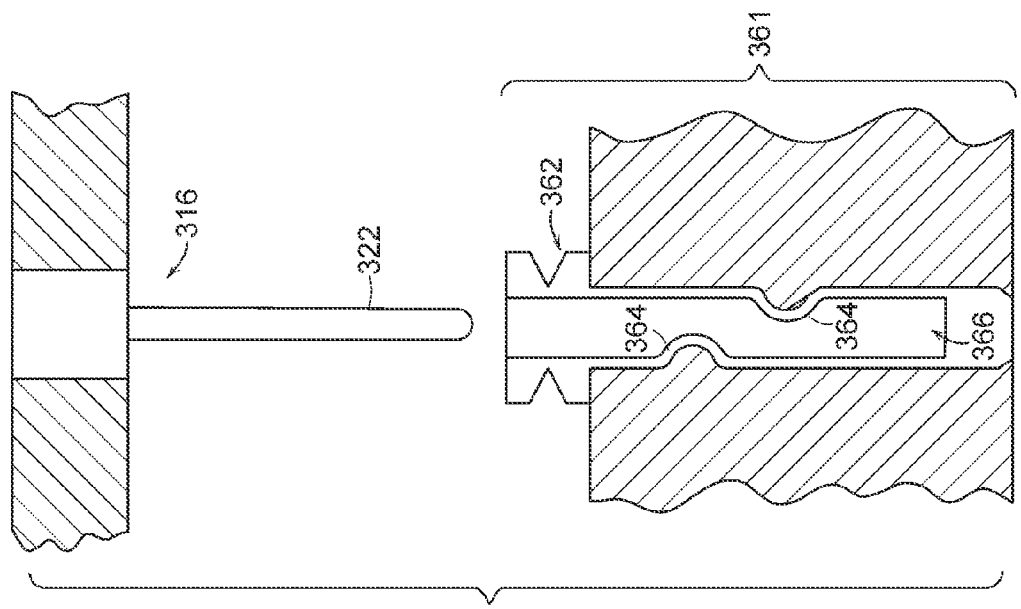

In another example, referring to FIGS. 11A and 11B, the socket assembly 361, as shown in FIGS. 6A and 6B, includes multiple deflection members 364, e.g., in the form of a protrusion arranged opposing another protrusion extending into the inner cavity 366 of female contacts 362. As shown in FIG. 11B, when resilient pins 322 of male contacts 316 engage the socket assembly 361, the resilient pins 322 are deflected by the multiple deflection members 364. This allows for multiple points of contact between the pin 322 and the female contacts 362.

Accordingly, other embodiments are within the scope of the following claims.

What is claimed is:
1. An intercoupling component comprising:
a first insulative support member including a first array of apertures extending from an first surface to an opposite second surface of the first insulative support member;
a second insulative support member including a second array of apertures extending from an first surface to an opposite second surface of the second insulative support member, the second array of apertures located in a pattern corresponding to the first array of apertures;

a plurality of first male contacts, each first male contact received within a corresponding aperture of the first array of apertures and extending beyond the second surface of the first insulative support member toward the second insulative support member, each first male contact having a first axis;

a plurality of second contacts, each second contact received within a corresponding aperture of the second array of apertures, each second contact having a second axis; and an alignment member configured to establish a specified position of the first insulative support member relative to the second insulative support member;

wherein the first axis of each male contact is offset from the second axis of a corresponding second contact when the first insulative support member is in the specified position relative to the second insulative support member.

2. The intercoupling component of claim 1, further comprising a deflection member configured to contact one of the plurality of male contacts.

3. The intercoupling component of claim 2, wherein the deflection member comprises a cone-shaped surface of the second insulative support member.

4. The intercoupling component of claim 2, wherein the second contacts are female contacts and the deflection member comprises a projection extending inward from an inner surface of one of the plurality of female contacts.

5. The intercoupling component of claim 2, wherein the second contacts each comprise an angled solid surface extending across the aperture of the second array of apertures receiving the second contact, the angled solid surface forming the deflection member.

6. The intercoupling component of claim 1, wherein the alignment member comprises first peripheral members extending from a first surface of a base, the base and the first peripheral members defining a first interior cavity of the alignment member, the first interior cavity receiving the first insulative support member.

7. The intercoupling component of claim 6, further comprising second peripheral members extending from a second surface of the base opposite the first surface of the base, the second peripheral members and the base defining a second interior cavity of the alignment member that slidably receives the second insulative support member.

8. The intercoupling component of claim 7, wherein the second peripheral members are resilient members biased toward a rest position.

9. The intercoupling component of claim 1, wherein the alignment member comprises an alignment pin.

10. The intercoupling component of claim 9, wherein the alignment pin extends beyond the first surface of the first insulative support member toward the second insulative support member farther than the male contacts extend.

11. An intercoupling component of the type used to electrically connect an array of electrical connection regions disposed on a first substrate to an array of electrical connection regions disposed on a second substrate, the intercoupling component comprising:

a first insulative support member including a first array of apertures extending from an first surface to an opposite second surface of the first insulative support member, the first array of apertures located in a pattern corresponding to the array of electrical connection regions on the first substrate;

a second insulative support member including a second array of apertures extending from an first surface to an opposite second surface of the second insulative support member, the second array of apertures located in a pattern corresponding to the array of electrical connection regions on the second substrate;

a plurality of first male contacts, each first male contact received within a corresponding aperture of the first array of apertures, each first male contact comprising a first portion coupled to the first insulative support member, a second portion spaced apart from the first portion, and a transition portion disposed between the first portion and the second portion wherein each first male contact is bent in the transition portion; and a plurality of second male contacts, each second male contact received within a corresponding aperture of the second array of apertures and extending beyond the second surface of the second insulative support member toward the first insulative support member.

12. The intercoupling component of claim 11, wherein each second male contact extends substantially linearly from a first end attached to the second insulative support member to a second end.

13. The intercoupling component of claim 11, wherein each second male contact comprises a first portion coupled to the first insulative support member, a second portion spaced apart from the first portion, and a transition portion disposed between the first portion and the second portion wherein each second male contact is bent in the transition region.

14. The intercoupling component of claim 11, wherein each aperture of the first array of apertures is sized to slidably receive a corresponding second male contact.

15. The intercoupling component of claim 14, wherein each aperture of the first array of apertures has a first section having a transverse cross-sectional area and has a second section having a second transverse cross-sectional area that is larger than the first transverse cross-sectional area.

16. The intercoupling component of claim 15, wherein each first male contact is disposed with the first portion of the first male contact engaging sidewalls of the first section of a corresponding aperture of the first array of apertures.

17. The intercoupling component of claim 11, further comprising an alignment member configured to establish a specified position of the first insulative support member relative to the second insulative support member.

18. The intercoupling component of claim 17, wherein the alignment member comprises first peripheral members extending from a first surface of a base, the base and the first peripheral members defining a first interior cavity of the alignment member, the first interior cavity receiving the first insulative support member.

19. The intercoupling component of claim 18, further comprising second peripheral members extending from a second surface of the base opposite the first surface of the base, the second peripheral members and the base defining a second interior cavity of the alignment member that slidably receives the second insulative support member.

20. The intercoupling component of claim 19, wherein the second peripheral members are resilient members biased toward a rest position.

* * * * *